United States Patent
Meterelliyoz et al.

(10) Patent No.: US 7,868,606 B2
(45) Date of Patent: Jan. 11, 2011

(54) PROCESS VARIATION ON-CHIP SENSOR

(75) Inventors: Mesut Meterelliyoz, West Lafayette, IN (US); Peilin Song, Lagrangeville, NY (US); Franco Stellari, Waldwick, NJ (US)

(73) Assignee: International Business Machines Corporation, Armonk, NY (US)

( * ) Notice: Subject to any disclaimer, the term of this patent is extended or adjusted under 35 U.S.C. 154(b) by 505 days.

(21) Appl. No.: 12/032,100

(22) Filed: Feb. 15, 2008

(65) Prior Publication Data

US 2009/0206821 A1    Aug. 20, 2009

(51) Int. Cl.
*G01N 27/00* (2006.01)
(52) U.S. Cl. .................. 324/76.11; 438/11; 438/17; 327/530; 327/534; 324/763; 324/765
(58) Field of Classification Search ............. 324/76.11; 438/11
See application file for complete search history.

(56) References Cited

U.S. PATENT DOCUMENTS

| | | | |
|---|---|---|---|
| 5,854,563 A | 12/1998 | Oh et al. | |
| 5,903,012 A * | 5/1999 | Boerstler | 257/48 |
| 6,091,283 A | 7/2000 | Murgula et al. | |
| 6,185,706 B1 | 2/2001 | Sugasawara | |
| 6,392,465 B1 | 5/2002 | Sauer | |
| 6,622,059 B1 * | 9/2003 | Toprac et al. | 700/121 |
| 6,623,992 B1 * | 9/2003 | Haehn et al. | 438/11 |
| 6,670,201 B2 * | 12/2003 | Kouno et al. | 438/14 |
| 6,853,177 B2 | 2/2005 | Shibayama et al. | |
| 6,972,703 B1 * | 12/2005 | Yen et al. | 341/136 |
| 7,002,375 B2 | 2/2006 | Hsu et al. | |
| 7,239,163 B1 * | 7/2007 | Ralston-Good et al. | 324/763 |
| 7,429,887 B2 * | 9/2008 | Sumita et al. | 327/534 |
| 7,736,916 B2 * | 6/2010 | Aghababazadeh et al. | 438/11 |
| 2004/0113649 A1 * | 6/2004 | Berthold et al. | 324/765 |

(Continued)

OTHER PUBLICATIONS

T. Kuroda et al. "A 0.9V 150 MHz 10mW 4mm2 2-D Discrete Cosine Transform Core Processor with Variable-Threshold-Voltage Scheme," ISSCC, Feb. 1996, pp. 166-168.

(Continued)

*Primary Examiner*—Melissa J Koval
*Assistant Examiner*—Benjamin M Baldridge
(74) *Attorney, Agent, or Firm*—Anne V. Dougherty; Ryan, Mason & Lewis, LLP

(57) ABSTRACT

Improved process variation sensors and techniques are disclosed, wherein both global and local variations associated with transistors on an integrated circuit can be monitored. For example, respective circuits for sensing a global process variation, a local process variation between neighboring negative-channel type transistors, and a local process variation between neighboring positive-channel type transistors are disclosed. Further, in one example, a method for sensing a process variation associated with transistors on an integrated circuit includes providing at least one process variation sensor on the integrated circuit, the process variation sensor comprising a sensing portion including one or more transistors and a loading and amplification portion including one or more transistors, and operating the one or more transistors of the sensing portion and the one or more transistors of the loading and amplification portion in a subthreshold region of transistor operation such that when a threshold voltage of at least one of the transistors changes, a process variation is sensed.

20 Claims, 8 Drawing Sheets

U.S. PATENT DOCUMENTS

2006/0071702 A1* 4/2006 Kase .......................... 327/530
2006/0148111 A1* 7/2006 Jang ............................ 438/14
2008/0224729 A1* 9/2008 Afghahi et al. ............... 326/33

OTHER PUBLICATIONS

M.M. Griffin et al., "A Process-Independent, 800-MB/s, DRAM Byte-Wide Interface Featuring Command Interleaving and Concurrent Memory Operation," IEEE Journal of Solid-State Circuits, Nov. 1998, pp. 1741-1751, vol. 33, No. 11.

Chris H. Kim, "Self Calibrating Circuit Design for Variation Tolerant VLSI Systems," Proceedings of the 11th IEEE International On-Line Testing Symposium, (IOLTS), Jul. 2005, pp. 1-6.

M. Bhushan et al., "Ring Oscillators for CMOS Process Tuning and Variability Control," IEEE Transactions on Semiconductor Manufacturing, Feb. 2006, pp. 10-18, vol. 19, No. 1.

N. Jayakumar et al., "A Self-Adjusting Scheme to Determine the Optimum RBB by Monitoring Leakage Currents," Jun. 2005, DAC, pp. 43-46, California.

* cited by examiner (a)

(b)

PROCESS VARIATION ON-CHIP SENSOR

FIELD OF THE INVENTION

The present invention generally relates to integrated circuit designs and, more particularly, to improved techniques for monitoring or sensing process variations in such integrated circuit designs.

BACKGROUND OF THE INVENTION

Technology scaling has been the driving force for the semiconductor industry in achieving higher performance and lower energy per switching in integrated circuit design. The cost paid with respect to traditional complementary metal oxide semiconductor (CMOS) scaling is the exponential increase in leakage power and process variations (PV), which are causing an increasingly negative effect on circuit performance and robustness. Since these internal fluctuations are unavoidable, it is critical to design circuits and systems which are robust to process variations. As is known, process variation is a statistical description of fluctuations in process outputs, in this case, fluctuations in the outputs of a semiconductor fabrication process.

However, the first step in designing these kinds of circuits is to sense process variations. Sensing process variations will not only give information about how the circuits should be calibrated to compensate variations but also provide feedback on what is going wrong during manufacturing.

The idea in sensing the process variation is to use the leakage current due to its high sensitivity to process variations. Different solutions for the same problem have been suggested in the literature. In T. Kuroda, et al., "A 0.9V 150 Mhz 10 mW 4 mm2 2-D discrete cosine transform core processor with variable-threshold-voltage scheme," ISSCC, pp. 166-167, February 1996, the disclosure of which is incorporated by reference herein, a leakage sensing circuit was proposed to monitor variable threshold voltage CMOS systems. However, the proposed circuit which is shown in FIG. 1(a) suffers from low sensing gain and area overhead for the process variation independent bias voltage generator circuit.

Another circuit for monitoring PV was proposed in M. M. Griffin, et al., "A process-independent, 800-MB/s DRAM byte-wide interface featuring command interleaving and concurrent memory operation," IEEE Journal of Solid-State Circuits, Vol. 33, Issue 11, pp. 1741-1751, November 1998, the disclosure of which is incorporated by reference herein, and shown in FIG. 1(b). Nevertheless, this circuit needs a PV independent current reference (IREF) which increases the area. Moreover, the diode-connected NMOS limits the voltage swing on VSEN which decreases the sensitivity of the circuit.

In another work, a sensor circuit is described in C. H. Kim, et al., "Self Calibrating Circuit Design for Variation Tolerant VLSI Systems," IOLTS, pp. 100-105, July 2005, the disclosure of which is incorporated by reference herein. However, as shown in FIG. 1(c), the need for PV insensitive bias current and voltage requires a large area and makes this circuit impractical.

Ring oscillators (RO) were suggested as process variation sensors in M. Bhushan, et al., "Ring Oscillators for CMOS Process Tuning and Variability Control," IEEE Transactions on Semiconductor Manufacturing, Vol. 19, No. 1, pp. 10-18, February 2006, the disclosure of which is incorporated by reference herein. However, due to the area overhead of ring oscillators, it is impractical to place a large number of ROs across the chip (integrated circuit or IC) for better resolution. Moreover, since the process variations are averaged out through the inverter chain in ROs, local process variations can not be observed with ROs.

N. Jayakumar, et al., "A Self-adjusting Scheme to Determine the Optimum RBB by Monitoring Leakage Currents," DAC, pp. 43-46, June 2005, the disclosure of which is incorporated by reference herein, suggests another leakage sensing mechanism which is based on monitoring the capacitor charge leaking through an negative-channel MOS (NMOS) device. The required capacitor bank and the body bias voltage, which needs triple well technology, make this mechanism not feasible.

SUMMARY OF THE INVENTION

Principles of the invention provide improved process variation sensors and techniques, wherein both global and local variations associated with transistors on an integrated circuit can be monitored.

By way of example, in one embodiment of the invention, a circuit for sensing a global process variation comprises the following components. The circuit comprises a first transistor, a second transistor, a third transistor, and a fourth transistor, each transistor having a gate terminal, a first source/drain terminal, and a second source/drain terminal, the first transistor and the third transistor being negative-channel type transistors, and the second transistor and the fourth transistor being positive-channel type transistors, wherein.

For the first transistor, the gate terminal is coupled to a bias voltage node, the first source/drain terminal is coupled to a ground node, and the second source/drain terminal is coupled to a sense voltage node.

For the second transistor, the gate terminal is coupled to the first source/drain terminal, which is coupled to a voltage source node, and the second source/drain terminal is coupled to the sense voltage node.

For the third transistor, the gate terminal is coupled to the first source/drain terminal, which is coupled to the ground node, and the second source/drain terminal is coupled to the bias voltage node.

For the fourth transistor, the gate terminal is coupled to the first source/drain terminal, which is coupled to the voltage source node, and the second source/drain terminal is coupled to the bias voltage node.

When the first transistor, the second transistor, the third transistor, and the fourth transistor are operated in a sub-threshold region of transistor operation and their threshold voltages shift in a similar manner, a global process variation is monitorable at the sense voltage node.

In another embodiment of the invention, a circuit for sensing a local process variation between neighboring negative-channel type transistors comprises the following components. The circuit comprises a first transistor, a second transistor, a third transistor selectable from a set of parallel transistors, and a fourth transistor, each transistor having a gate terminal, a first source/drain terminal, and a second source/drain terminal, the first transistor and the third transistor, and each other transistor from the set of parallel transistors, being negative-channel type transistors, and the second transistor and the fourth transistor being positive-channel type transistors.

For the first transistor, the gate terminal is coupled to a bias voltage node, the first source/drain terminal is coupled to a ground node, and the second source/drain terminal is coupled to a sense voltage node.

For the second transistor, the gate terminal is coupled to the first source/drain terminal, which is coupled to a voltage source node, and the second source/drain terminal is coupled to the sense voltage node.

For the third transistor, when selected from the set of parallel transistors, the gate terminal is coupled to the first source/drain terminal, which is coupled to the ground node, and the second source/drain terminal is coupled to the bias voltage node.

For the fourth transistor, the gate terminal is coupled to the first source/drain terminal, which is coupled to the voltage source node, and the second source/drain terminal is coupled to the bias voltage node.

When the first transistor, the second transistor, the selected third transistor, and the fourth transistor are operated in a subthreshold region of transistor operation, a first voltage value is monitorable at the sense voltage node. Then when another one of the set of parallel transistors is selected to operate in the position of the third transistor, and when the first transistor, the second transistor, the newly selected third transistor, and the fourth transistor are operated in the subthreshold region of transistor operation and the threshold voltage of the newly selected third transistor changes from a threshold value of the formerly selected third transistor, a second voltage value is monitorable at the sense voltage node. A local process variation is then determined based on a comparison of the first voltage value and the second voltage value.

In yet another embodiment of the invention, a circuit for sensing a local process variation between neighboring positive-channel type transistors comprises the following components. The circuit comprises a first transistor, a second transistor, a third transistor, and a fourth transistor selectable from a set of parallel transistors, each transistor having a gate terminal, a first source/drain terminal, and a second source/drain terminal, the first transistor and the third transistor being negative-channel type transistors, and the second transistor and the fourth transistor, and each other transistor from the set of parallel transistors, being positive-channel type transistors.

For the first transistor, the gate terminal is coupled to the first source/drain terminal, which is coupled to a ground node, and the second source/drain terminal is coupled to a sense voltage node.

For the second transistor, the gate terminal is coupled to a bias voltage node, the first source/drain terminal is coupled to a voltage source node, and the second source/drain terminal is coupled to the sense voltage node.

For the third transistor, the gate terminal is coupled to the first source/drain terminal, which is coupled to the ground node, and the second source/drain terminal is coupled to the bias voltage node.

For the fourth transistor, when selected from the set of parallel transistors, the gate terminal is coupled to the first source/drain terminal, which is coupled to the voltage source node, and the second source/drain terminal is coupled to the bias voltage node.

When the first transistor, the second transistor, the third transistor, and the selected fourth transistor are operated in a subthreshold region of transistor operation, a first voltage value is monitorable at the sense voltage node. Then when another one of the set of parallel transistors is selected to operate in the position of the fourth transistor, and when the first transistor, the second transistor, the third transistor, and the newly selected fourth transistor are operated in the subthreshold region of transistor operation and the threshold voltage of the newly selected fourth transistor changes from a threshold value of the formerly selected fourth transistor, a second voltage value is monitorable at the sense voltage node.

A local process variation is then determined based on a comparison of the first voltage value and the second voltage value.

In a further embodiment of the invention, a method for sensing a process variation associated with transistors on an integrated circuit comprises providing at least one process variation sensor on the integrated circuit, the process variation sensor comprising a sensing portion including one or more transistors and a loading and amplification portion including one or more transistors, and operating the one or more transistors of the sensing portion and the one or more transistors of the loading and amplification portion in a subthreshold region of transistor operation such that when the threshold voltage of at least one of the transistors changes, a process variation is sensed.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Principles of the present invention provide process variation sensors which can be used in monitoring the local as well as global variations on integrated circuits. The small area occupied by the sensor makes it possible to place a large number of them in the same chip and increase the measurement resolution. The existing sensor designs do not have this property due to their area overhead. With the sensors proposed herein, it is also possible to detect the variations between two neighboring negative-channel MOS (NMOS) or positive-channel MOS (PMOS) transistors, thus offering local variation detection. The devices may preferably be in the form of negative-channel field effect transistors (nFETs) or positive-channel FETs (pFETs).

The inventive sensor circuits employ transistors operating fully in the subthreshold region in order to increase the sensitivity to process variations. This also guarantees low power dissipation on the sensor. As is known, the subthreshold region is the region of operation of a transistor when the gate-to-source voltage of the transistor is below the threshold voltage of the transistor. The inventive circuits, described herein, fully exploit the subthreshold region operation of transistors to achieve a linear, highly sensitive output. Moreover, existing sensors require process variation insensitive bias voltage/current generators which require a large area and limit the applicability of the design. In our design, there is no need for process insensitive bias generators since all NMOS/PMOS transistors are directly connected to GND/VDD, where GND refers to ground and VDD refers to the supply voltage.

A. Global Variations

The idea of using subthreshold region in the design of process variation sensor can be utilized for sensing both global and local variations. Typically, global variations are due to systematic variations and local variations are due to random dopant fluctuations.

Figure 1:
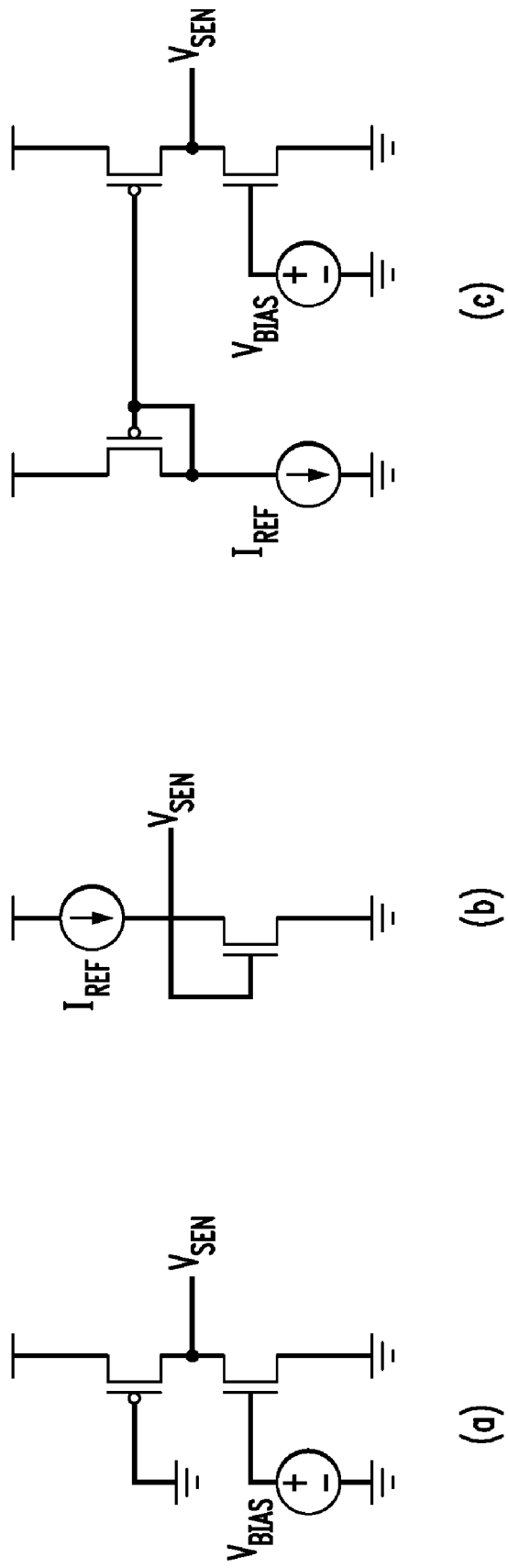
FIGS. 1(a) through 1(c) show existing process variation sensors.
Figure 2A:
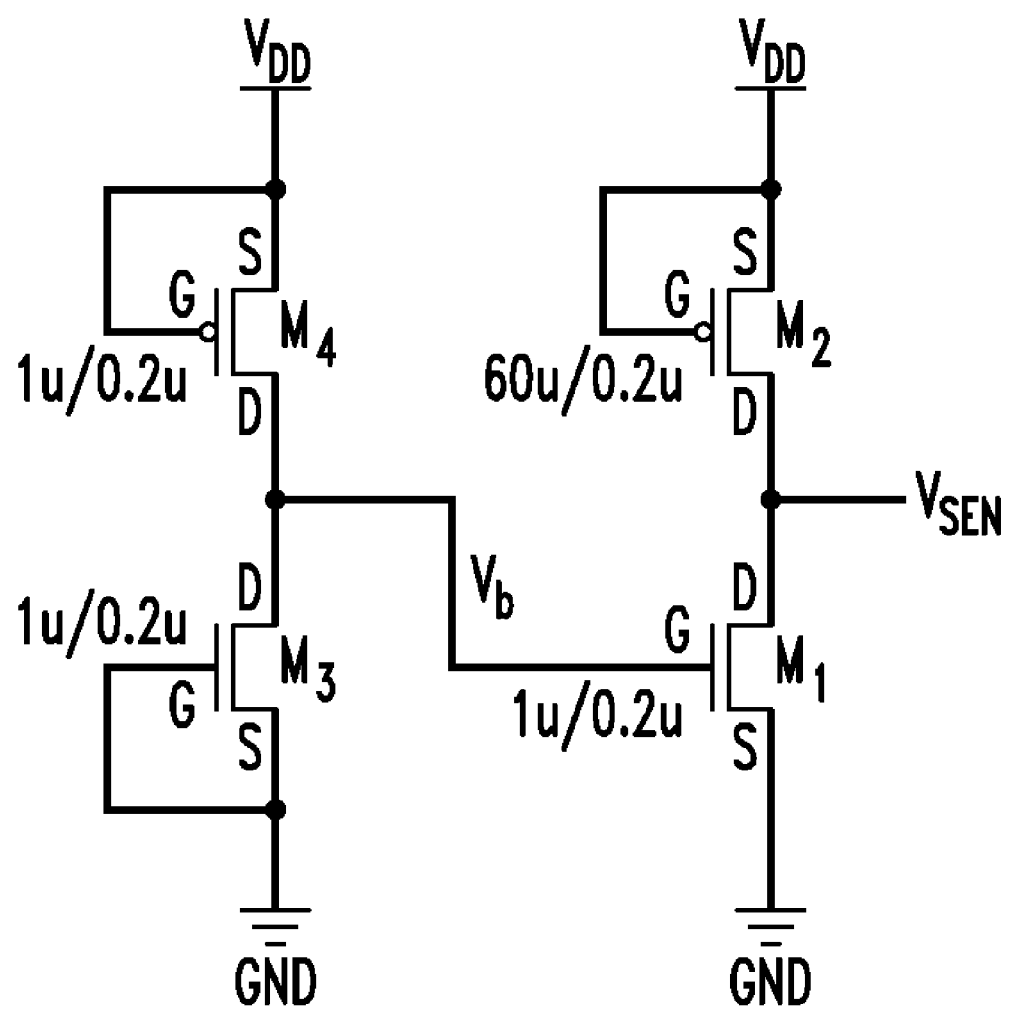
FIG. 2(a) shows a circuit to sense global process variations, according to an embodiment of the invention.

An inventive circuit proposed to sense global variations, according to one embodiment, is shown in FIG. 2(a). In our work, we assumed that devices in close proximity tend to behave the same way under variations which do not change quickly by position. Variations in effective length and oxide thickness of the transistors are considered examples of slowly changing variations, which are referred as global variations in this work.

The proposed circuit in this illustrative embodiment is composed of four transistors, M1, M2, M3 and M4, all operating in the subthreshold region. As the standard gate symbol denotes, M1 and M3 are NMOS transistor devices and M2 and M4 are PMOS transistor devices. Furthermore, as shown, each transistor includes a gate terminal, a source terminal and a drain terminal, as is known. It is also known that source and drain terminals of a given device are interchangeable. Thus, the drain terminal and the source terminal can each be generally referred to as a "source/drain terminal" such that, from the nature of the circuit, it is evident which terminal is coupled (connected) and acting as a drain terminal and which is coupled (connected) and acting as a source terminal. For ease of explanation below, the terminals will be referred to simply as source, drain and gate.

The W/L (width/length) ratio for each transistor is shown next to each device in micrometers. In the simulation environment, we assumed that all the variations in the process can be modeled as a shift in threshold voltage of devices. To simulate the sensitivity of our sensor, we observed the nodes Vb and Vsen while sweeping the threshold voltage of all transistors from −50 milliVolts (mV) to +50 mV. Vb is the bias voltage provided to the gate of M1 from the drain of M4 (drain of M3). Vsen is the sense voltage observed from the drain of M2 (drain of M1). The behavior of these nodes can be seen in FIG. 2(b), the simulation results using IBM CMOS10sf technology.

Further, as illustrated, the gates and sources of M2 and M4 are connected directly to VDD, while the gate and source of M3 and the source of M1 are directly connected to GND.

Figure 2B:
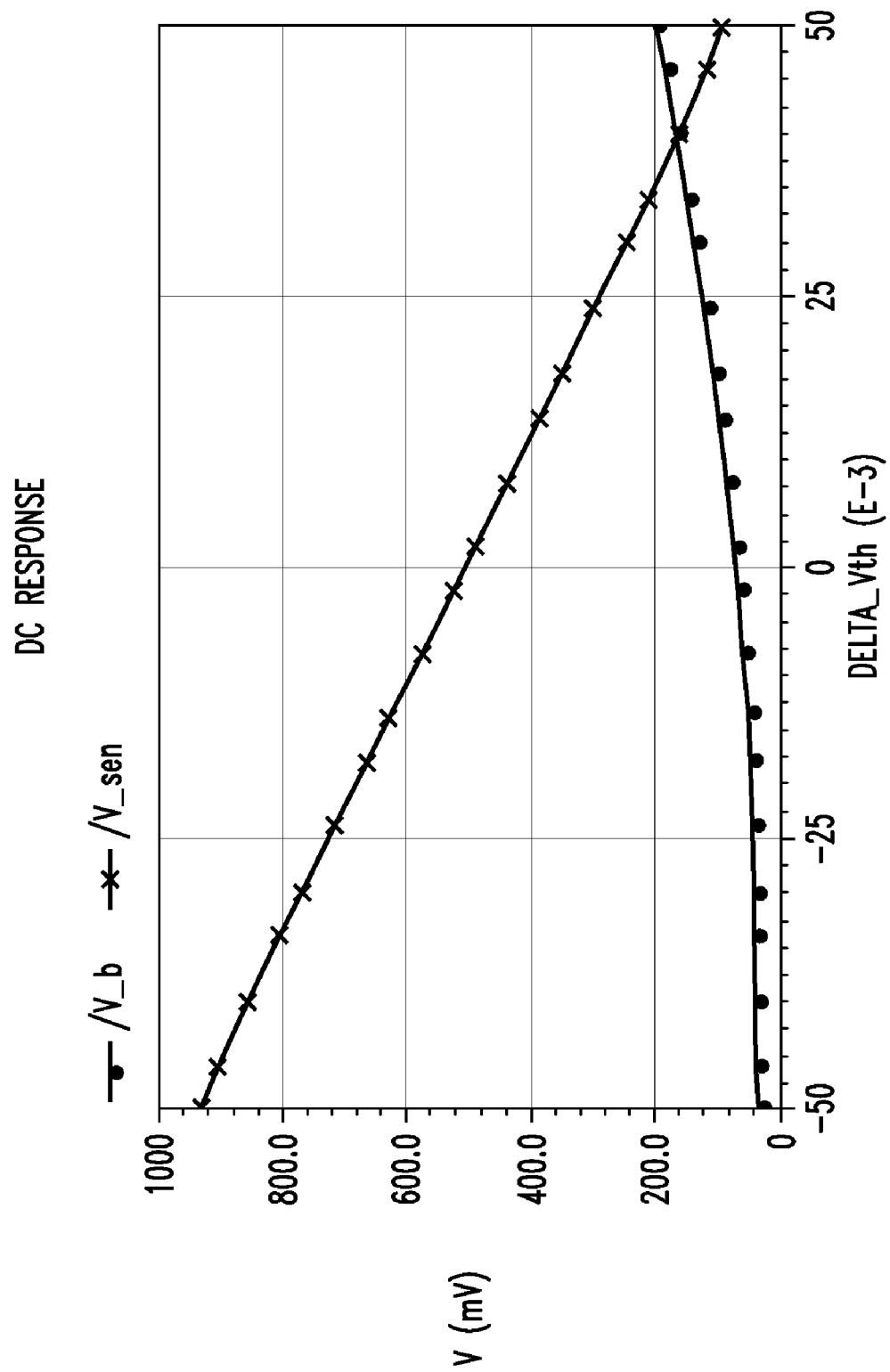
FIG. 2(b) shows simulation results for the circuit of FIG. 2(a).

As observed from FIG. 2(b), the value of Vb changes as the threshold voltage of M3 and M4 changes. The main reason for the change in Vb is the difference in DIBL (Drain Induced Barrier Lowering) coefficients for PMOS and NMOS transistors. The subthreshold current expression can be simplified as follows while η represents the DIBL coefficient:

$$I_{subthreshold} = \alpha e^{\beta(V_{gs} - V_{th} + \eta V_{ds})}(1 - e^{qV_{ds}/kT})$$

Under subthreshold conditions, transistors M3 and M4 act like two resistors in series and Vb is determined after voltage division between these two resistors. As the threshold voltage of each transistor changes, the resistances of PMOS and NMOS transistors change at a different rate due to the difference in DIBL coefficients. This modifies Vb from 0 mV to 200 mV as the threshold voltage varies from −50 mV to +50 mV from its nominal value. ±50 mV is known to be a good value for modeling threshold voltage variations for CMOS10sf technology with 1V supply voltage.

The second half of the circuit is composed of transistors M1 and M2. As the gate voltage of M1 (Vb) changes from 0 mV to 200 mV, the resistance of M1 decreases dramatically (compared to the resistance of M2) due to the exponential dependence on gate voltage in the subthreshold region. Change in the resistance of M1 modifies Vsen as shown in FIG. 2(b) and a linear output which is varying from 900 mV to 50 mV for ±50 mV shift in the threshold voltage can be achieved. This presents a highly sensitive output which is critical for better characterization of the variations.

In the circuit, all transistors operate in the subthreshold region. This minimizes the power consumed by the sensor. In addition, using small transistor sizes (for example, transistors of the sizes represented by the W/L ratios in FIG. 2(a)) makes it possible to place a large number of sensors across the chip for better planar resolution. It is to be understood that a global variation can be detected by measuring Vb and Vsen for multiple sensors (i.e., multiple ones of the sensor shown in FIG. 2(a)) implemented on an integrated circuit.

To sum up, we have presented a linear, ultra-low power, highly sensitive process variation sensor for global variations with a very small area overhead.

B. Local Variations

However, another important component for process variations is random doping fluctuation. Due to decreasing channel lengths, the number and placement of random doping in the channel affects the threshold voltage of even two neighboring transistors. In order to sense this kind of variation, we have proposed a sensor circuit calibrated for local variations. A circuit diagram designed to sense the variations in NMOSs is illustrated in the context of FIGS. 3(a) through 3(e). As will be explained below, two such neighboring transistors can be two of the parallel M3s shown in FIG. 3(b).

Figure 3A:
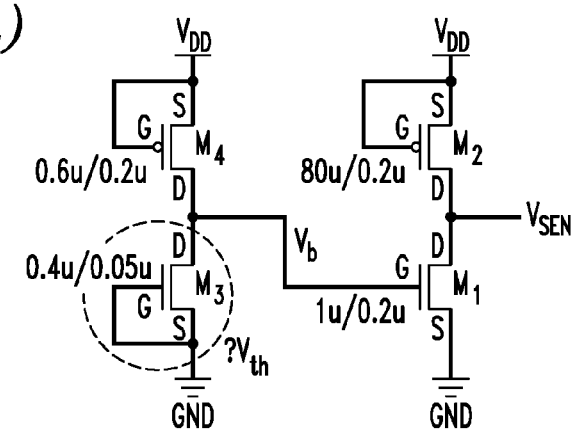
FIGS. 3(a) and 3(b) show a circuit to sense local process variations, according to an embodiment of the invention.
Figure 3B:
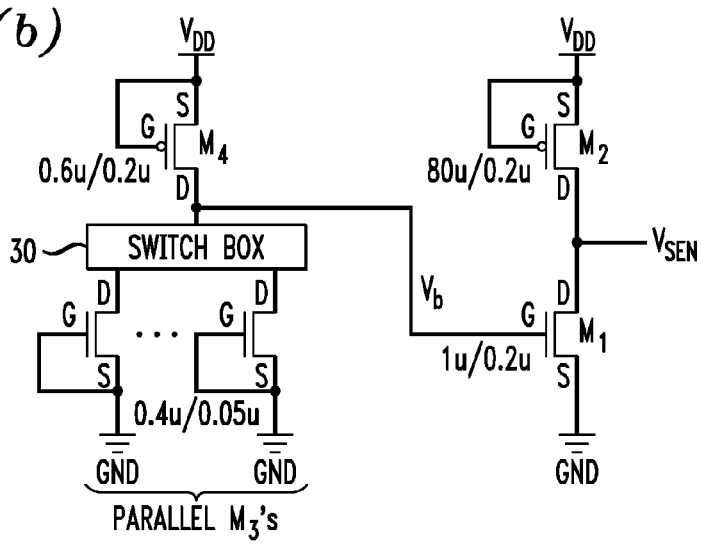
Figure 3C:
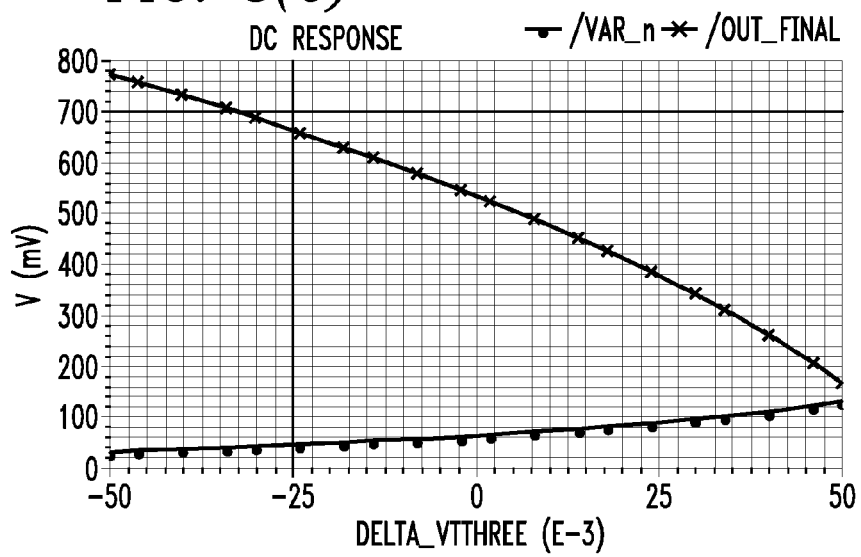
FIG. 3(c) shows simulation results for the circuit of FIGS. 3(a) and 3(b).

As shown in FIG. 3(a), the circuit topology for sensing local variations in NMOS transistors is the same as in FIG. 2(a), except that the transistors are sized differently. In this embodiment, the transistors are sized to sense the differences in threshold voltages of parallel M3 transistors which are placed very closely, as shown in FIG. 3(b). The sizes of parallel M3s are kept at a minimum size to be able to introduce random doping fluctuations. The other transistors are sized relatively large (for length and width) to decrease the effect of process variations on these transistors.

Figure 3D:
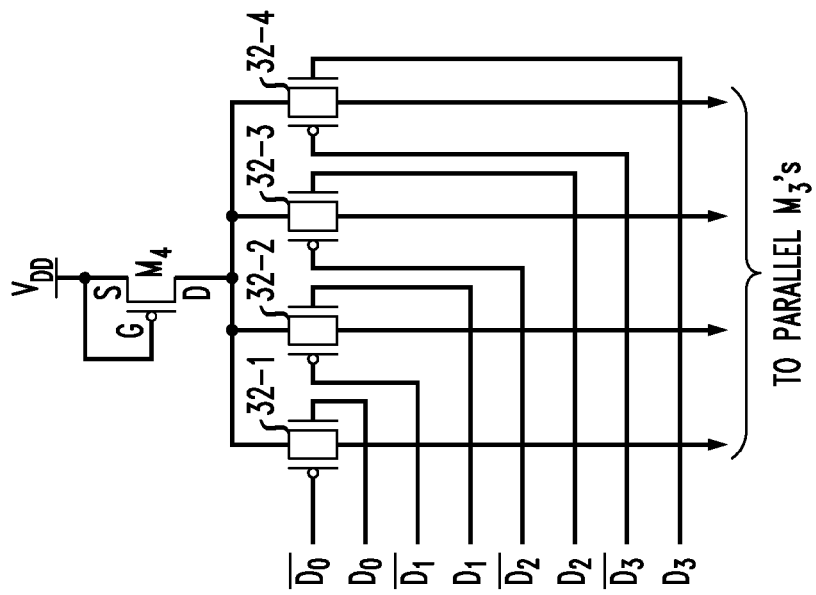
FIG. 3(d) shows a switch box for the parallel transistors of FIG. 3(b).
Figure 3E:
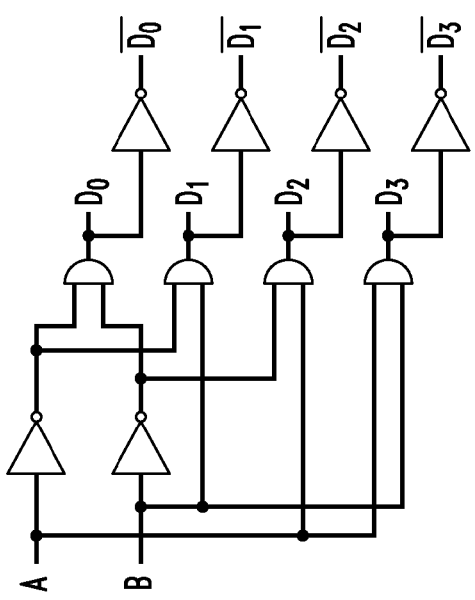
FIG. 3(e) shows a decoder design for use in controlling the switch box of FIG. 3(d).

The complete circuit topology with switch network (switch box 30) is shown in FIG. 3(b). It is to be appreciated that the switch box allows only one of the parallel M3 transistors to be contacted (functionally part of the circuit) while all the other M3 transistors are closed (not functionally part of the circuit). FIG. 3(d) shows a switch box (with switch elements 32-1 through 32-4) for 4-parallel M3 transistors, as an example. Note that, for the switch design, one may use only NMOS transistors for NMOS local sensing and only PMOS transistors for PMOS local sensing. To control the box of FIG. 3(d), a 2-4 decoder has to be used. A truth table, shown in Table I, is used to design the decoder, shown in FIG. 3(e). Equation (1) derived from truth table I is used to construct the circuit shown in FIG. 3(e).

Using the topology of FIG. 3(b), we can detect the process variations or Vt (threshold voltage) changes of each M3 at a time and this design guarantees that we are sensing only the difference between two parallel M3 transistors since all the rest of the circuit is common for all measurements. That is, it is to be understood that we monitor the voltage levels of Vsen or Vb for each selected M3 to monitor the local variations there between.

In order to simulate this circuit, we swept the threshold voltage of M3 in FIG. 3(a) while keeping other transistors' threshold voltage constant. The working principle of the circuit is the same as the circuit shown in FIG. 2(a). As the node voltages for Vb and Vsen can be seen in FIG. 3(c), we achieved a low power, linear, highly sensitive process variation sensor which can detect the variations between neighboring NMOS transistors with high accuracy.

Figure 4:
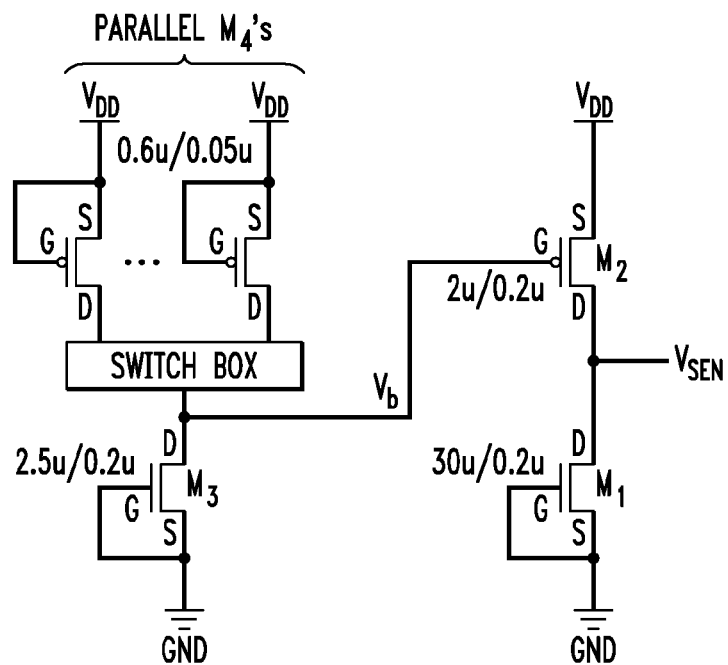
FIG. 4(a) shows a circuit to sense local process variations, according to another embodiment of the invention.
FIG. 4(b) shows simulation results for the circuit of FIG. 4(a).
Figure 4:
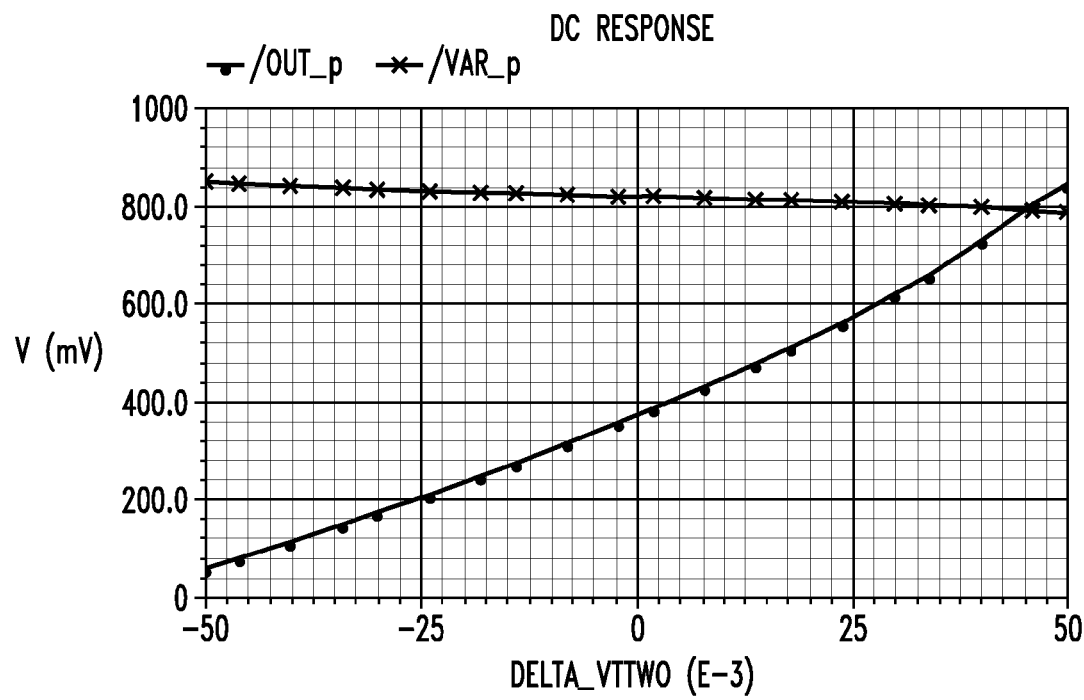

Furthermore we have extended the same idea to sense the variations between two neighboring PMOS transistors. The complete circuit diagram with switch box can be seen in FIG. 4(a).

Similar to FIG. 3(b), we kept parallel PMOS transistors (M4s) at minimum size while sizing other transistors for linear and highly sensitive output. As seen in the figure, although the circuit topology is slightly different than the NMOS case, the operation principles are still the same. The simulation results for Vb and Vsen obtained by sweeping the threshold voltage of M4 can be seen in FIG. 4(b). Accordingly, a low power, linear, highly sensitive process variation sensor is achieved for detecting the variations across PMOS transistors.

Advantageously, as has been described above, principles of the invention provide a process variation monitor based on measuring subthreshold leakage in which all transistors are operating in a subthreshold region. That is, loading and amplification circuits are operating in a subthreshold region. By way of example, M1 shown in FIG. 3(a) is used as the loading and amplification gate and, similarly, M2 shown in FIG. 4(a) is the loading and amplification gate. The sensor circuit does not require any voltage or current bias circuit. Systematic and random process variations can be measured in this way. Either NMOS or PMOS variations can be measured. A statistic of local random variations can be measured by implementing an array of transistors connected to the same load and amplification circuit. The individual transistors in the array are connected to the load and amplification circuit through a hierarchical switch network. The switch network is implemented with high threshold voltage transistors/gates. The transistors have different orientations, sizes, threshold voltages, in order to evaluate the sensitivity of these parameters on the process variation.

C. Sensor Design

A complete integrated circuit sensor system design is composed of NMOS and PMOS local variation sensor circuits, as explained above, with 256 parallel NMOS and PMOS transistors, switch networks and decoders for switch networks. In order to investigate the dependence of process variations on the length, width and orientation of the channel, we used parallel PMOS and NMOS transistors with two different sets of length, width and orientation. The schematic of the design can be seen in FIG. 5. It is to be understood that the operation of the circuit in FIG. 5 is a straightforward expansion of the circuits shown in FIG. 3(b) and FIG. 4(a), as described above.

Figure 5:
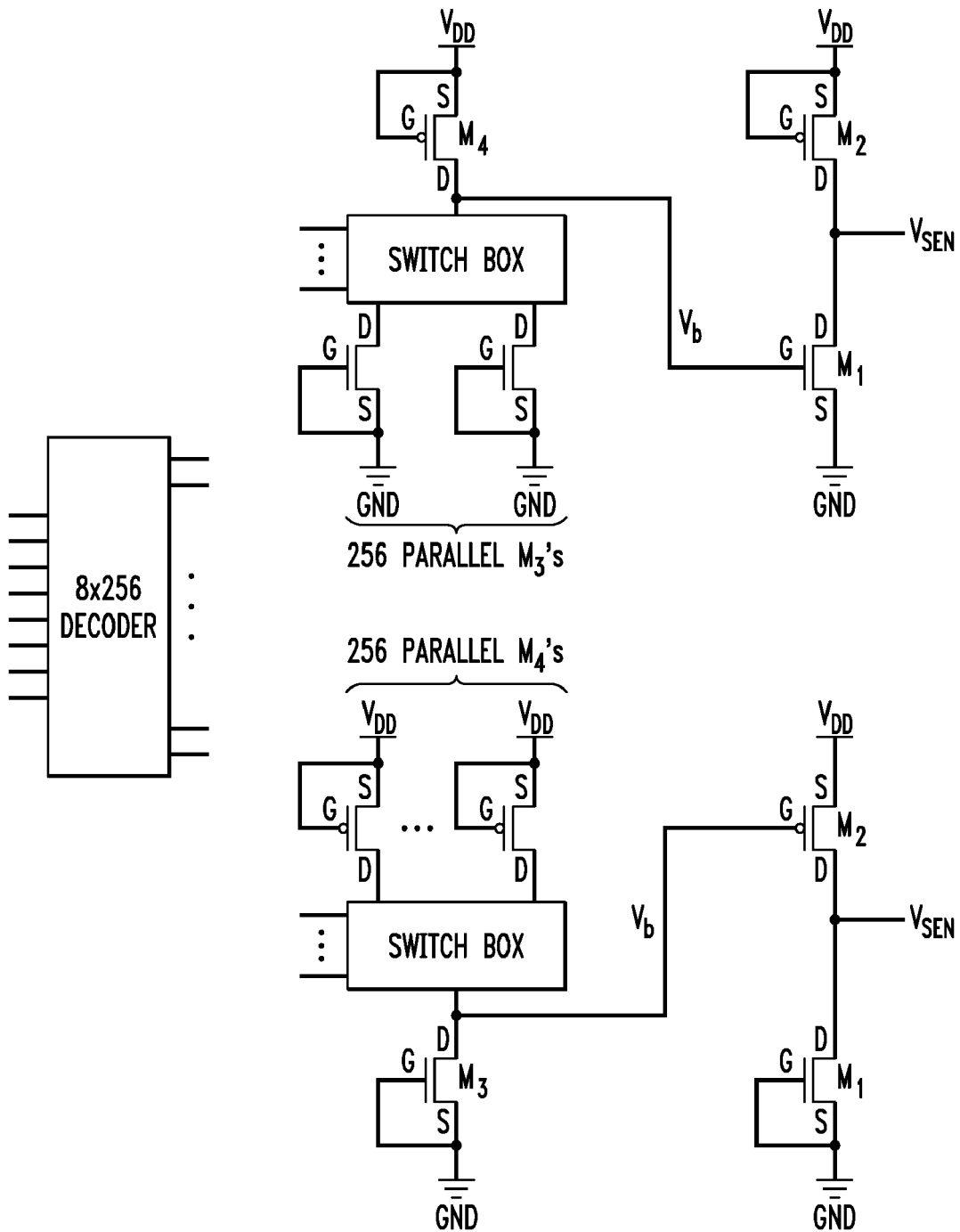
FIG. 5 shows a process variation sensor system, according to an embodiment of the invention.

It is also to be understood that while multiple ones of the sensors of FIG. 3(b) and FIG. 4(a) are shown in the sensor system design of FIG. 5, an alternative embodiment can have multiple ones of the sensors of FIG. 2(a).

Further, in switch networks, in order to eliminate the leakage components from non-selected parallel paths, high-Vth (threshold voltage) transistors can be used. This will reduce both subthreshold and gate leakage (due to thicker oxide) on non-selected paths. Using high-Vth transistors in the switch is advantageous, because, our sensor uses subthreshold current for sensing and reducing other leakage components improves functionality and sensitivity.

D. Design Structure

Circuitry according to one more aspects of the present invention may be realized as integrated circuits; thus, at least a portion of the techniques of one or more aspects or embodiments of the present invention described herein may be implemented in an integrated circuit. In forming integrated circuits, a plurality of identical die are typically fabricated in a repeated pattern on a surface of a semiconductor wafer. Each die can include one or more of the circuits described herein, and may include other structures or circuits, or other types of cells. The individual die are cut or diced from the wafer, then packaged as an integrated circuit. A person of skill in the art will know how to dice wafers and package die to produce integrated circuits. Integrated circuits so manufactured are considered part of the present invention.

Circuits as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips.

Figure 6:
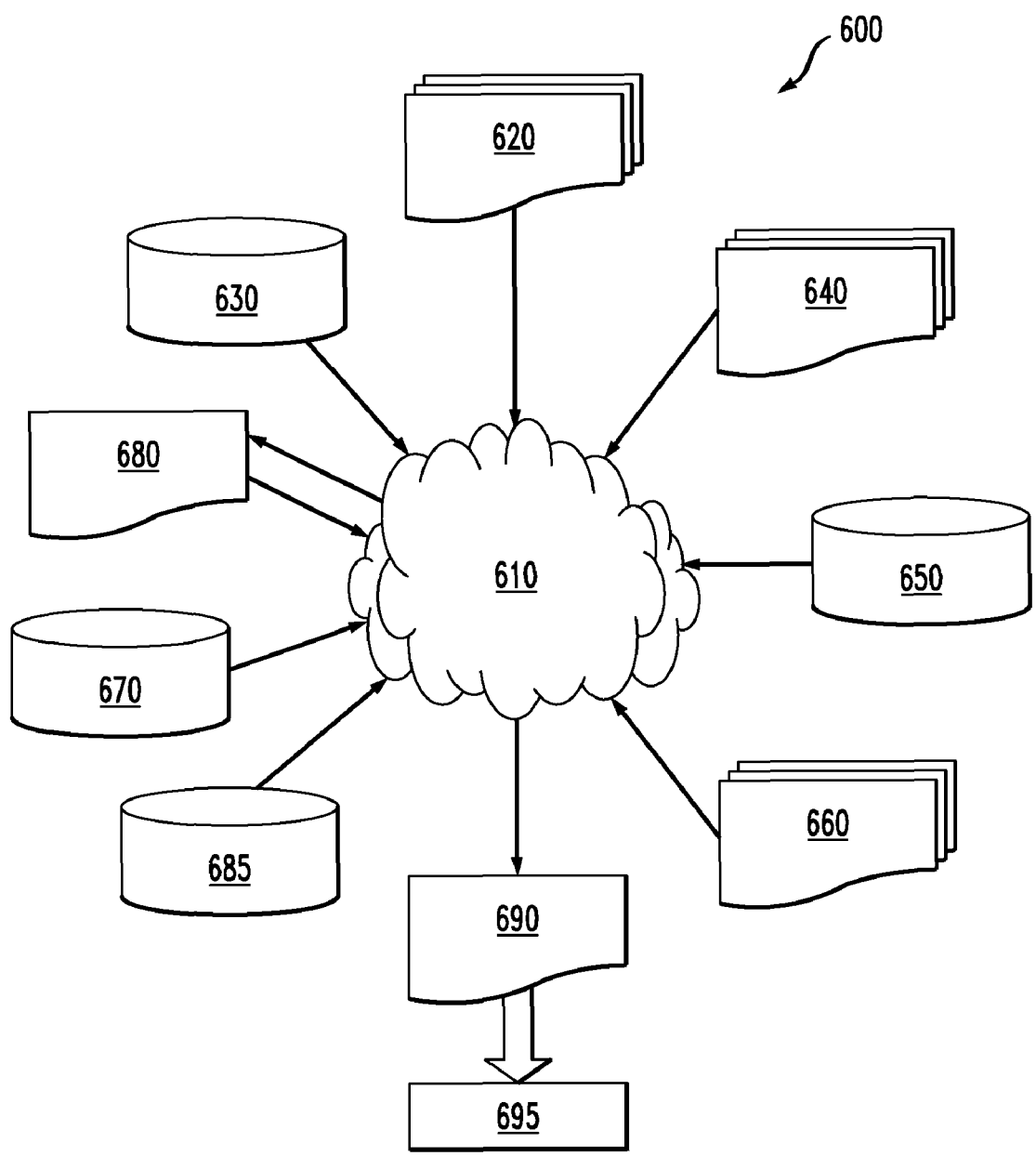
FIG. 6 shows a design flow, according to an embodiment of the invention.

FIG. 6 shows a block diagram of an exemplary design flow 600 used for example, in semiconductor design, manufacturing, and/or test. Design flow 600 may vary depending on the type of IC being designed. For example, a design flow 600 for building an application specific IC (ASIC) may differ from a design flow 600 for designing a standard component. Design structure 620 is preferably an input to a design process 610 and may come from an IC provider, a core developer, or other design company or may be generated by the operator of the design flow, or from other sources. Design structure 620 comprises at least one of the embodiments of the invention as shown in FIGS. 1-5 in the form of schematics or HDL, a hardware-description language (e.g., Verilog, VHDL, C, etc.). Design structure 620 may be contained on one or more machine readable media. For example, design structure 620 may be a text file or a graphical representation of at least one of the embodiments of the invention as shown in FIGS. 1-5. Design process 610 preferably synthesizes (or translates) at least one of the embodiments of the invention as shown in FIGS. 1-5 into a netlist 680, where netlist 680 is, for example, a list of wires, transistors, logic gates, control circuits, I/O, models, etc. that describes the connections to other elements and circuits in an integrated circuit design and recorded on at least one machine readable medium. This may be an iterative process in which netlist 680 is resynthesized one or more times depending on design specifications and parameters for the circuit.

Design process 610 may include using a variety of inputs; for example, inputs from library elements 630 which may house a set of commonly used elements, circuits, and devices, including models, layouts, and symbolic representations, for a given manufacturing technology, design specifications 640, characterization data 650, verification data 660, design rules 670, and test data files 685 (which may include test patterns and other testing information). Design process 610 may further include, for example, standard circuit design processes such as timing analysis, verification, design rule checking, place and route operations, etc. One of ordinary skill in the art of integrated circuit design can appreciate the extent of possible electronic design automation tools and applications used in design process 610 without deviating from the scope and spirit of the invention. The design structure of the invention is not limited to any specific design flow.

Design process 610 preferably translates at least one of the embodiments of the invention as shown in FIGS. 1-5, along with any additional integrated circuit design or data (if applicable), into a second design structure 690. Design structure 690 resides on a storage medium in a data format used for the exchange of layout data of integrated circuits and/or symbolic data format (e.g., information stored in a GDSII (GDS2), GL1, OASIS, map files, or any other suitable format for storing such design structures). Design structure 690 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce at least one of the embodiments of the invention as shown in FIGS. 1-5. Design structure 690 may then proceed to a stage 695 where, for example, design structure 690: proceeds to tape-out, is released to manufacturing, is released to a mask house, is sent to another design house, is sent back to the customer, etc.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A circuit for sensing a global process variation in an integrated circuit device, comprising:
a first transistor, a second transistor, a third transistor, and a fourth transistor, each transistor having a gate terminal, a first source/drain terminal, and a second source/drain terminal, the first transistor and the third transistor being negative-channel type transistors, and the second transistor and the fourth transistor being positive-channel type transistors, wherein:
for the first transistor, the gate terminal is coupled to a bias voltage node, the first source/drain terminal is coupled to a ground node, and the second source/drain terminal is coupled to a sense voltage node;
for the second transistor, the gate terminal is coupled to the first source/drain terminal, which is coupled to a voltage source node, and the second source/drain terminal is coupled to the sense voltage node;
for the third transistor, the gate terminal is coupled to the first source/drain terminal, which is coupled to the ground node, and the second source/drain terminal is coupled to the bias voltage node;
for the fourth transistor, the gate terminal is coupled to the first source/drain terminal, which is coupled to the voltage source node, and the second source/drain terminal is coupled to the bias voltage node; such that when the first transistor, the second transistor, the third transistor, and the fourth transistor are operated in a subthreshold region of transistor operation and their threshold voltages shift in a similar manner, a global process variation in the integrated circuit device is monitored at the sense voltage node.

2. The circuit of claim 1, wherein the first transistor and the third transistor are negative-channel type metal oxide semiconductor (NMOS) transistors.

3. The circuit of claim 1, wherein the second transistor and the fourth transistor are positive-channel type metal oxide semiconductor (PMOS) transistors.

4. The circuit of claim 1, wherein the circuit is implemented on an integrated circuit such that the sense voltage node of the circuit is used to monitor a global process variation in all transistors of the sensor implemented on the integrated circuit.

5. The circuit of claim 1, wherein the global process variation monitored at the sense voltage node is used to detect the change in effective length of all transistors in the sensor implemented on the integrated circuit.

6. The circuit of claim 1, wherein the global process variation monitored at the sense voltage node is used to detect the change in oxide thickness of all transistors in the sensor implemented on the integrated circuit.

7. The circuit of claim 1, wherein the global process variation is monitored at the sense voltage node without a need for a separate bias generator in the circuit.

8. A circuit for sensing a local process variation between neighboring negative-channel type transistors in an integrated circuit device, comprising:
a first transistor, a second transistor, a third transistor that is selectable from a set of parallel transistors, and a fourth transistor, each transistor having a gate terminal, a first source/drain terminal, and a second source/drain terminal, wherein the first transistor and the third transistor, and each other transistor from the set of parallel transistors, being negative-channel type transistors, and the second transistor and the fourth transistor being positive-channel type transistors, wherein:
for the first transistor, the gate terminal is coupled to a bias voltage node, the first source/drain terminal is coupled to a ground node, and the second source/drain terminal is coupled to a sense voltage node;
for the second transistor, the gate terminal is coupled to the first source/drain terminal, which is coupled to a voltage source node, and the second source/drain terminal is coupled to the sense voltage node;
for the third transistor, when selected from the set of parallel transistors, the gate terminal is coupled to the first source/drain terminal, which is coupled to the ground node, and the second source/drain terminal is coupled to the bias voltage node;

for the fourth transistor, the gate terminal is coupled to the first source/drain terminal, which is coupled to the voltage source node, and the second source/drain terminal is coupled to the bias voltage node;

such that when the first transistor, the second transistor, the selected third transistor, and the fourth transistor are operated in a subthreshold region of transistor operation, a first voltage value is monitored at the sense voltage node; then when another one of the set of parallel transistors is selected to operate in the position of the third transistor, and when the first transistor, the second transistor, the newly selected third transistor, and the fourth transistor are operated in the subthreshold region of transistor operation and a threshold voltage of the newly selected third transistor changes from a threshold value of the formerly selected third transistor, a second voltage value is monitored at the sense voltage node;

a local process variation is then determined based on a comparison of the first voltage value and the second voltage value.

9. The circuit of claim 8, further comprising a selection circuit for use in selecting a transistor from the set of parallel transistors to operate in the position of the third transistor.

10. The circuit of claim 8, wherein the first transistor and each of the set of parallel transistors are negative-channel type metal oxide semiconductor (NMOS) transistors.

11. The circuit of claim 8, wherein the second transistor and the fourth transistor are positive-channel type metal oxide semiconductor (PMOS) transistors.

12. The circuit of claim 8, wherein the circuit is implemented on an integrated circuit such that the sense voltage node of the circuit is used to monitor a local process variation in one or more transistors implemented on the integrated circuit.

13. The circuit of claim 8, wherein the local process variation monitored at the sense voltage node is a random doping fluctuation in the one or more transistors implemented on the integrated circuit.

14. A circuit for sensing a local process variation between neighboring positive-channel type transistors in an integrated circuit device, comprising:

a first transistor, a second transistor, a third transistor, and a fourth transistor that is selectable from a set of parallel transistors, each transistor having a gate terminal, a first source/drain terminal, and a second source/drain terminal, the first transistor and the third transistor being negative-channel type transistors, and the second transistor and the fourth transistor, and each other transistor from the set of parallel transistors, being positive-channel type transistors, wherein:

for the first transistor, the gate terminal is coupled to the first source/drain terminal, which is coupled to a ground node, and the second source/drain terminal is coupled to a sense voltage node;

for the second transistor, the gate terminal is coupled to a bias voltage node, the first source/drain terminal is coupled to a voltage source node, and the second source/drain terminal is coupled to the sense voltage node;

for the third transistor, the gate terminal is coupled to the first source/drain terminal, which is coupled to the ground node, and the second source/drain terminal is coupled to the bias voltage node;

for the fourth transistor, when selected from the set of parallel transistors, the gate terminal is coupled to the first source/drain terminal, which is coupled to the voltage source node, and the second source/drain terminal is coupled to the bias voltage node;

such that when the first transistor, the second transistor, the third transistor, and the selected fourth transistor are operated in a subthreshold region of transistor operation, a first voltage value is monitored at the sense voltage node;

then when another one of the set of parallel transistors is selected to operate in the position of the fourth transistor, and when the first transistor, the second transistor, the third transistor, and the newly selected fourth transistor are operated in the subthreshold region of transistor operation and the threshold voltage of the newly selected fourth transistor changes from a threshold value of the formerly selected fourth transistor, a second voltage value is monitored at the sense voltage node;

a local process variation is then determined based on a comparison of the first voltage value and the second voltage value.

15. The circuit of claim 14, further comprising a selection circuit for use in selecting a transistor from the set of parallel transistors to operate in the position of the fourth transistor.

16. The circuit of claim 14, wherein the first transistor and the third transistor are negative-channel type metal oxide semiconductor (NMOS) transistors.

17. The circuit of claim 14, wherein the second transistor and each of the set of parallel transistors are positive-channel type metal oxide semiconductor (PMOS) transistors.

18. The circuit of claim 14, wherein the circuit is implemented on an integrated circuit such that the sense voltage node of the circuit is used to monitor a local process variation in one or more transistors implemented on the integrated circuit.

19. The circuit of claim 14, wherein the local process variation monitored at the sense voltage node is a random doping fluctuation in the one or more transistors implemented on the integrated circuit.

20. A method for sensing a process variation associated with transistors on an integrated circuit, the method comprising the steps of:

providing at least one process variation sensor on the integrated circuit, the process variation sensor comprising a sensing portion including one or more transistors and a loading and amplification portion including one or more transistors, the transistors comprising a first transistor, a second transistor, a third transistor, and a fourth transistor, each transistor having a gate terminal, a first source/drain terminal, and a second source/drain terminal, the first transistor and the third transistor being negative-channel type transistors, and the second transistor and the fourth transistor being positive-channel type transistors, or the first transistor and the third transistor being positive-channel type transistors, and the second transistor and the fourth transistor being negative-channel type transistors, wherein:

for the first transistor, the gate terminal is coupled to a bias voltage node, the first source/drain terminal is coupled to a ground node, and the second source/drain terminal is coupled to a sense voltage node;

for the second transistor, the gate terminal is coupled to the first source/drain terminal, which is coupled to a voltage source node, and the second source/drain terminal is coupled to the sense voltage node;

for the third transistor, the gate terminal is coupled to the first source/drain terminal, which is coupled to the ground node, and the second source/drain terminal is coupled to the bias voltage node;

for the fourth transistor, the gate terminal is coupled to the first source/drain terminal, which is coupled to the voltage source node, and the second source/drain terminal is coupled to the bias voltage node; and operating the first, second, third and fourth transistors in a subthreshold region of transistor operation;

monitoring the sense voltage node such that when a threshold voltage of at least one of the transistors changes, a process variation is sensed.

* * * * *